United States Patent
Hwang et al.

(10) Patent No.: US 7,969,798 B2
(45) Date of Patent: Jun. 28, 2011

(54) PHASE CHANGE MEMORY DEVICES AND READ METHODS USING ELAPSED TIME-BASED READ VOLTAGES

(75) Inventors: Young-Nam Hwang, Gyeonggi-do (KR); Dae-Hwan Kang, Seoul (KR); Chang-Yong Um, Seoul (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 12/431,292

(22) Filed: Apr. 28, 2009

(65) Prior Publication Data

US 2009/0303785 A1 Dec. 10, 2009

(30) Foreign Application Priority Data

Jun. 4, 2008 (KR) ........................ 10-2008-0052739

(51) Int. Cl.
  *G11C 5/14* (2006.01)
(52) U.S. Cl. .............. 365/189.09; 365/163; 365/185.25; 365/185.18; 365/189.15
(58) Field of Classification Search .............. 365/189.09, 365/163, 185.25, 185.18, 189.15
See application file for complete search history.

(56) References Cited

U.S. PATENT DOCUMENTS

| 6,646,922 | B2 * | 11/2003 | Kato ........................ 365/185.25 |
| 6,882,569 | B2 * | 4/2005 | Hosono et al. ........... 365/185.17 |
| 7,283,387 | B2 | 10/2007 | Cho et al. |
| 7,649,776 | B2 * | 1/2010 | Abiko et al. .............. 365/185.12 |
| 7,787,307 | B2 * | 8/2010 | Sarin ......................... 365/185.24 |
| 2007/0058425 | A1 | 3/2007 | Cho et al. |
| 2008/0055972 | A1 | 3/2008 | Oh et al. |
| 2008/0244338 | A1 * | 10/2008 | Mokhlesi et al. ............. 714/702 |
| 2009/0016100 | A1 * | 1/2009 | Jeong ............................ 365/163 |

FOREIGN PATENT DOCUMENTS

| JP | 2007-73176 A | 3/2007 |
| JP | 2008-52867 A | 3/2008 |
| KR | 10-0674992 B1 | 1/2007 |
| KR | 10-0809334 B1 | 2/2008 |

OTHER PUBLICATIONS

Gill et al. "Ovonic Unified Memory—A High-Performance Nonvolatile Memory Technology for Stand-Alone Memory and Embedded Applications" *2002 IEEE International Solid-State Circuits Conference* 3 pp.
Ielmini et al. "Recovery and Drift Dynamics of Resistance and Threshold Voltages in Phase-Change Memories" *IEEE Transactions on Electron Devices* 54(2):308-315, Feb. 2007.
Pirovano et al. "Electronic Switching in Phase-Change Memories" *IEEE Transactions on Electron Devices*, 51(3): 452-459 (2004).
Pirovano et al. "Low-Field Amorphous State Resistance and Threshold Voltage Drift in Chalcogenide Materials" *IEEE Transactions on Electron Devices*, 51(5):714-719 (2004).

* cited by examiner

*Primary Examiner* — Viet Q Nguyen
(74) *Attorney, Agent, or Firm* — Myers Bigel Sibley Sajovec, PA

(57) ABSTRACT

A variable resistance memory device includes a memory cell connected to a bit line and a clamp circuit configured to provide either a first read voltage or a second read voltage to the bit line according to an elapsed time from a write operation of the memory cell. Related methods are also described.

7 Claims, 15 Drawing Sheets

US 7,969,798 B2

PHASE CHANGE MEMORY DEVICES AND READ METHODS USING ELAPSED TIME-BASED READ VOLTAGES

CROSS-REFERENCE TO RELATED APPLICATION

This application claims priority under 35 U.S.C. §119 to Korean Patent Application No. 10-2008-0052739, filed on Jun. 4, 2008, the disclosure of which is hereby incorporated by reference in its entirety as if set forth fully herein.

BACKGROUND

The present invention relates to semiconductor memory devices. More particularly, the present invention relates to variable resistance memories and read methods thereof.

There have been increased demands for semiconductor memory devices capable of being accessed randomly and realizing high integration and large volume. Such semiconductor memory devices may include a flash memory device which may be used in portable electronic devices. Further, there have been developed semiconductor memory devices using non-volatile materials instead of capacitors in DRAM. For example, such semiconductor memory devices may include Ferroelectric RAM (FRAM) using ferroelectric capacitors, Magnetic RAM (MRAM) using Tunneling Magneto-Resistive (TMR) films, phase change memory using chalcogenide alloys, and the like. In particular, the phase change memory is a non-volatile memory device and is made via a relatively simple fabrication process. Further, it is possible to realize a large-capacity memory in a low cost with the phase change memory.

A phase change memory cell may use a material which is capable of being changed between structured states indicating different electric read characteristics. For example, there are known memory devices made of chalcogenide material including germanium (Ge), antimony (Sb), and tellurium (Te) (hereinafter, referring to as GST material). The GST material may have an amorphous state indicating a relatively high resistivity and a crystalline state indicating a relatively low resistivity. That is, data corresponding to an amorphous or crystalline state may be written in a phase change memory cell by heating a GST material. Heating duration and magnitude may be determined according to whether a GST material remains at an amorphous state or a crystalline state. High and low resistivities indicate written logic values 1 and 0, which is sensed by measuring a resistivity of the GST material. Accordingly, a phase change memory device is a type of variable-resistance memory device.

A memory cell of a phase change memory device includes a resistive element and a switching element. FIG. 1 shows a resistive element 10 of a phase change memory cell. The resistive element 10 may a variable resistance value according to an applied current I. Referring to a cross-sectional view of the resistive element 10, the resistive element 10 includes a top electrode 11, a phase change material 12, a contact plug 13, and a bottom electrode 14. The top electrode 11 is connected to a bit line, and the lower electrode 14 is connected between the contact plug 13 and an access transistor or diode (not shown). The contact plug 13 is formed of a conductive material (e.g., TiN) and is also called a heater plug. The phase change material 12 is provided between the top electrode 11 and the contact plug 13. A phase of the phase change material 12 may be changed according to amplitude, duration, and/or fall time of an applied current pulse. A phase of the phase change material corresponding to a set or reset may be determined according to an amorphous volume 15 as illustrated in FIG. 1. In general, an amorphous phase and a crystal phase correspond to a reset state and a set state, respectively. An amorphous volume is reduced as a phase is changed from an amorphous state to a crystal state. The phase change material 12 has a resistance which is changed according to a formed amorphous volume 15. That is, written data may be determined according to an amorphous volume 15 of the phase change material 12 formed according to different current pulses.

Unfortunately, the phase change material 12 may suffer threshold voltage recovery and resistance drift according to an elapsed time after it is programmed. This makes a sensing margin of the phase change memory reduced.

FIG. 2 is a graph showing threshold voltage recovery and resistance drift caused at a resistive element 10 in FIG. 1. Referring to FIG. 2, a horizontal axis indicates an elapsed time after a memory cell is programmed. A vertical axis indicates a resistance value of a memory cell. A resistance of a resistive element 10 may be changed according to an elapsed time due to various causes. Such causes may include threshold voltage recovery and resistance drift.

A threshold voltage recovery problem may arise when a threshold voltage is not stabilized immediately after a write pulse is supplied to the resistive element 10. That is, electrons of high concentration may be captured at a donor-like trap (C3+) layer in an energy band of a memory cell which is programmed to have a reset state according to applying of a write pulse to the resistive element 10. Accordingly, before the electrons of high concentration captured at the donor-like trap (C3+) layer are recombined, electron concentration of a conduction band may become high due to the captured electrons. If a sensing operation is conducted before the electrons of high concentration captured at the donor-like trap (C3+) layer are recombined, a reset resistance R_rst of the resistive element 10 becomes low. This means that it is not easy to secure a sensing margin. After a write pulse is applied as illustrated in FIG. 2, at an elapse interval ΔT1 of a time t0, a variation curve 26 of a reset resistance R_rst is sharply changed since the threshold voltage recovery acts as a dominant factor. Referring to an elapsed time t1, a distribution of the reset resistance R_rst shows a distribution chart 23. In this case, a distribution of a set resistance R_set shows a distribution chart 21. Accordingly, in order to provide a sufficient sensing margin SM1, a sensing operation has to be conducted after a write operation is conducted and then a sufficient time (e.g., 30 ns) elapses.

Together with the threshold voltage recovery, a resistance drift also causes reduction of a sensing margin. After a write pulse is applied, as illustrated in FIG. 2, a reset resistance R_rst of a resistance element 10 after an elapse of a time t0 is not maintained but increased according to an elapse after it is programmed. After a write pulse is applied, an average value of a reset resistance R_rst is changed after an elapse of a time t2. In a multi-level cell, this characteristic of the resistance element may reduce a sensing margin. Resistance variation according an elapse may act as a restriction factor to realize a multi-level phase change memory device.

Threshold voltage recovery and resistance drift characteristics of a phase change material are disclosed in papers, entitled "Electronic Switching in Phase-Change Memories" (A. Pirovano et al, IEEE Trans. Electron Devices, 51, 452 (2004)), "Low-Field Amorphous State Resistance and Threshold Voltage Drift in Chalcogenide Materials" (A. Pirovano et al, IEEE Trans. Electron Devices, 51, 1 (2004)), "Ovonic Unified Memory—A High-Performance Nonvolatile Memory Technology for Stand-Alone Memory and Embedded Applications" (M. Gill et al, ISSCC, (2002)), and "Recovery and Drift Dynamics of Resistance and Threshold Voltages in Phase-Change Memories" (D. Ielmini, IEEE Trans. Electron Devices, 54, 308 (2007)), the entirety of which is hereby incorporated by reference.

In order to provide added value of memory devices, it is desirable to provide high-speed write and read functions. In particular, a phase change memory device may necessitate a high access speed in order to support various services such as a random access memory such as DRAM, SSD, and a storage unit for a mobile apparatus. However, the above-described threshold voltage recovery and resistance drift characteristics of the phase change material may act as a restriction factor to perform a write and a read operation in a high speed. It may be difficult to perform a high-speed write operation without securing of a sufficient sensing margin in order to apply a scheme in which a write-verify read operation is conducted. This technical obstacle may prevent the use of the resistance element at a multi-level cell MLC.

SUMMARY OF THE INVENTION

The present invention is directed to phase change memory devices capable of performing read and write operations in a high speed and read methods thereof.

Some embodiments of the present invention provide a variable resistance memory device which comprises a memory cell connected to a bit line, and a clamp circuit configured to provide either a first read voltage or a second read voltage to the bit line according to an elapsed time from a write operation of the memory cell.

Other embodiments of the present invention provide a variable resistance memory device which comprises a memory cell connected to a bit line. A clamp circuit is configured to clamp the bit line to either a first read voltage or a second read voltage higher than the first read voltage. A sense amplifier circuit is connected to the bit line via the clamp circuit and is configured to sense a voltage level of the bit line. A control logic is configured to control the clamp circuit so as to clamp the bit line to either the first read voltage or the second read voltage according to a read mode.

Still other embodiments of the present invention provide a read method of a variable resistance memory device which comprises determining an elapsed time from a program time of a memory cell to a point of time when a read operation is conducted and sensing data of the memory cell by variably providing a clamp voltage to clamp a bit line of the memory cell according to the elapsed time.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
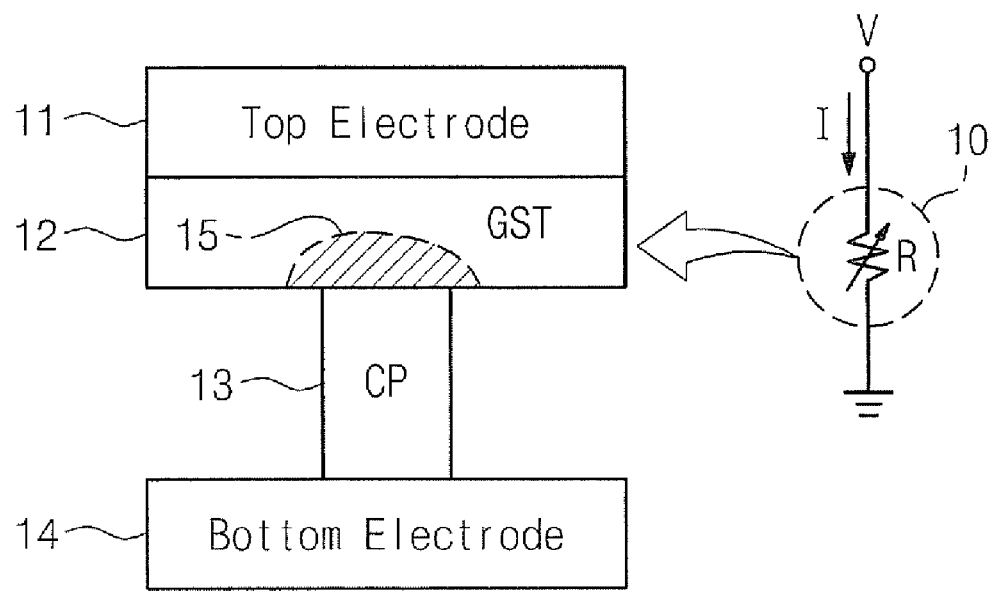
FIG. 1 is a diagram showing a structure of a variable resistance memory cell.
Figure 2:
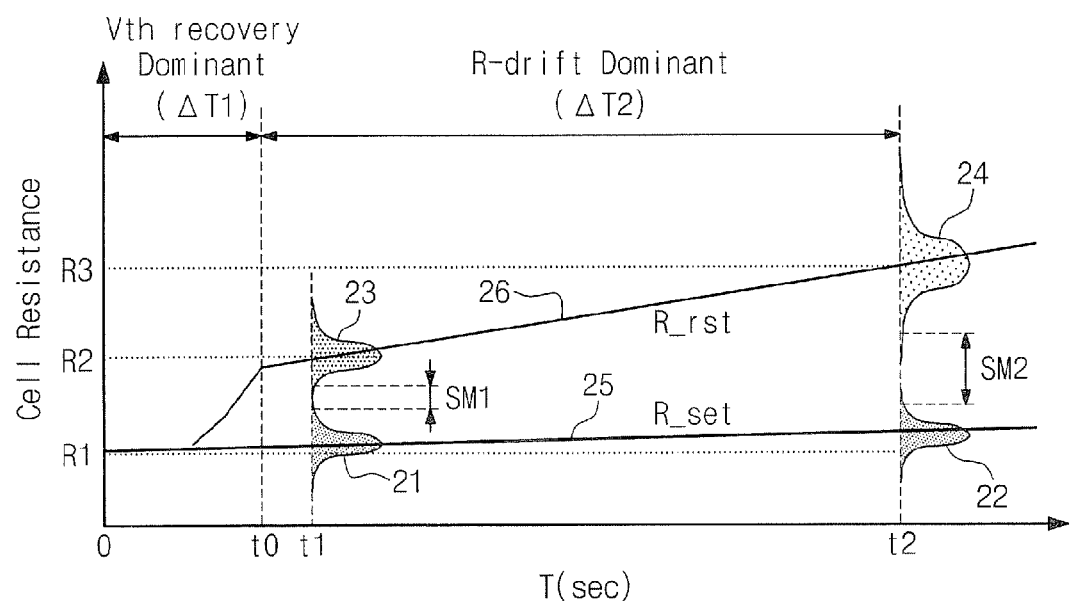
FIG. 2 is a graph showing characteristics of a variable resistance memory cell.

Below, a phase change memory device may be used as an example variable resistance memory device to describe characteristics and functions of the present invention. Exemplary embodiments of the present invention will be described below in more detail with reference to the accompanying drawings, showing a flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" means a "non-exclusive or" such that any and all combinations of one or more of the associated listed items are provided and may be abbreviated as "/". In contrast, the term "either . . . or" means an "exclusive or" such that only one of the enumerated items is provided, and may be abbreviated as "or".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising,"

"having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will also be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
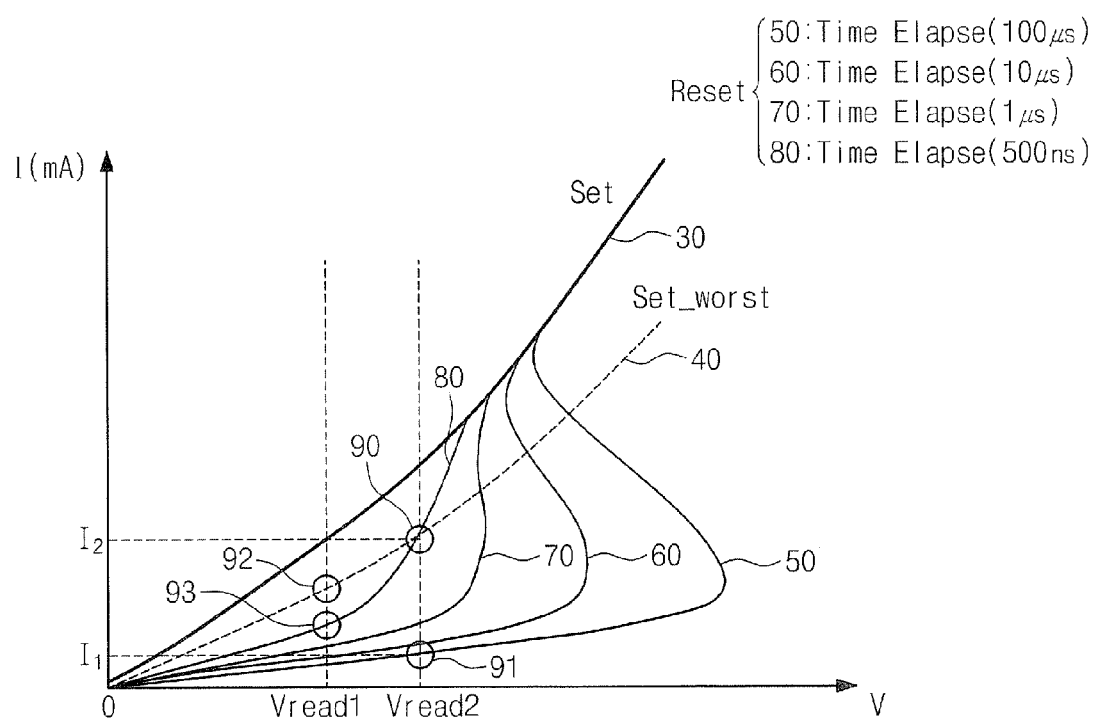
FIG. 3 is a graph showing compensating a threshold voltage recovery in accordance with various embodiments of the present invention.

FIG. 3 is a graph showing a method of compensating a threshold voltage recovery in accordance with various embodiments of the present invention. Referring to FIG. 3, there is provided a method for solving reduction of a sensing margin according to threshold voltage recovery and resistance drift characteristics of a phase change material. Various embodiments of the present invention can apply a read voltage (or, a sensing voltage) to a resistance element 10 (refer to FIG. 1) at a sensing operation differently according to an elapsed time after a write pulse is applied thereto. That is, there is applied a high read voltage Vread2 at a data read operation which is conducted after a threshold voltage recovery is completed. There is applied to a relatively low read voltage Vread1 at a read operation in a case where an elapsed time is short.

Current-voltage characteristic curves of a resistance element 10 are illustrated with respect to set states 30 and 40 and reset states 50, 60, 70, and 80, respectively. Curves each corresponding to reset states indicate current-voltage characteristics according to an elapsed time after a write pulse is applied. The reset curve 80, indicating the case that an elapsed time after applying of a write pulse is short, shows a state where a threshold voltage is not increased sufficiently. The reset curve 80 is intersected with a set curve 40 having a large set resistance value at an intersection 90. Accordingly, in a case where a sensing operation is conducted by use of a read voltage Vread2 at an elapsed time 500 ns after writing reset data, an error may arise inevitably. But, in a case where a sensing operation is performed by use of the read voltage Vread2 at a point of time when an elapsed time 500 ns is passed after applying of a write pulse, a set curve 40 having a large set resistance value and a reset curve 80 have different current values (corresponding to 92 and 93). That is, a sensing margin may be increased.

It is possible to shorten a time needed to conduct a read operation by selecting a read voltage level according to an elapsed time after a write pulse is applied. That is, in a case where the first read voltage Vread1 having a low level is applied, a sensing margin is secured with a time interval between a write point of time and a read point of time being reduced. This characteristic means that there is shortened an execution point of time of a verification read operation in which a read pulse is provided following a write pulse. This characteristic may provide a reliable high-speed write operation of a phase charge memory device performing a write verify operation.

Figure 4:
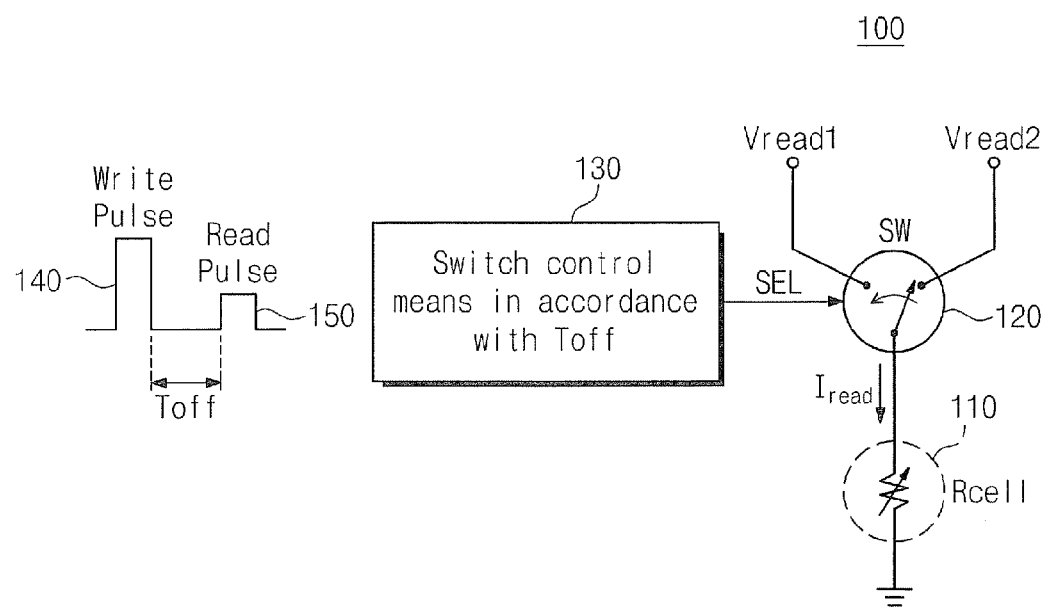
FIG. 4 is a diagram showing reading of a phase change material according to various embodiments of the present invention.

FIG. 4 is a circuit diagram showing a schematic concept of providing a read voltage (or, a sensing voltage) according to various embodiments of the present invention. Referring to FIG. 4, there is described the concept for selectively providing read voltages Vread1 and Vread2 of different levels according to an elapsed time after a write pulse is provided. Herein, a time difference between a write pulse and a read pulse is named an elapsed time Toff.

The resistance element 110 may include a phase change material 12 (refer to FIG. 1). Accordingly, the resistance element 110 may have threshold voltage recovery and resistance drift characteristics. The resistance element 110 may be programmed to have a resistance value corresponding to a set state or a reset state. This program operation may be performed by providing of a write pulse 140. In general, a resistance value of the resistance element 110 programmed to a set state is not affected heavily by an elapsed time. But, in case of the resistance element 110 programmed to a reset state having a large resistance value, a sensing margin may be reduced according to the threshold voltage recovery and resistance drift characteristics.

A clamp circuit includes switch 120 that is configured to selectively supply a read voltage to the resistance element 110. At a read mode, the switch 120 selects either the first read voltage Vread1 or the second read voltage Vread2 and supplies the selected read voltage to the resistance element 110. Herein, the first read voltage Vread1 is relatively lower than the second read voltage Vread2. The switch 120 operates in response to the control of a switch control means 130.

The switch control means 130 may supply a selection signal SEL to the switch 120 according to an elapsed time Toff from supplying of a write pulse 140 to supplying of a read pulse 150. In a case where the elapsed time Toff is short, the switch control means 130 may supply the selection signal SEL to the switch 120 so as to select the first read voltage Vread1 of a relatively low level. On the other hand, in a case where the elapsed time Toff is sufficiently long, the switch control means 130 may supply the selection signal SEL to the switch 120 so as to select the second read voltage Vread2 of a relatively high level. Herein, the write pulse 140 may be considered as a current or a voltage pulse for programming the resistance element 110 to the reset state. The switch control means 130 judges an elapsed time Toff at a read operation in order to selectively supply a read voltage according to the elapsed time Toff. In a phase change memory device, the switch control means 130 is able to include a function of measuring the above-described elapsed time Toff. But, reduction of a sensing margin due to the elapsed time Toff may be caused at a write-verify read operation. This is because an elapsed time Toff between a write pulse and a read pulse is short. Thus, determining of the elapsed time Toff may be made via an operation of discriminating a data read mode and a verification read mode. That is, if a write command is input, the switch control means 130 controls the switch 120 such that the first read voltage Vread1 is selected at a verification read operation. If a read command is input, the switch control means 130 controls the switch 120 such that the second read voltage is selected.

In general, the resistance element 110 is affected heavily by the threshold voltage recovery and resistance drift characteristics at a read operation when no elapsed time Toff is sufficiently provided. But, a sensing margin can be improved due to effects described in FIG. 3 in a case where a read voltage applied to the resistance element 110 is dropped and provided although an elapsed time Toff is short. This characteristic means that a high-speed write operation is conducted at a phase change memory device of writing data according to a write-verify read manner.

Figure 5:
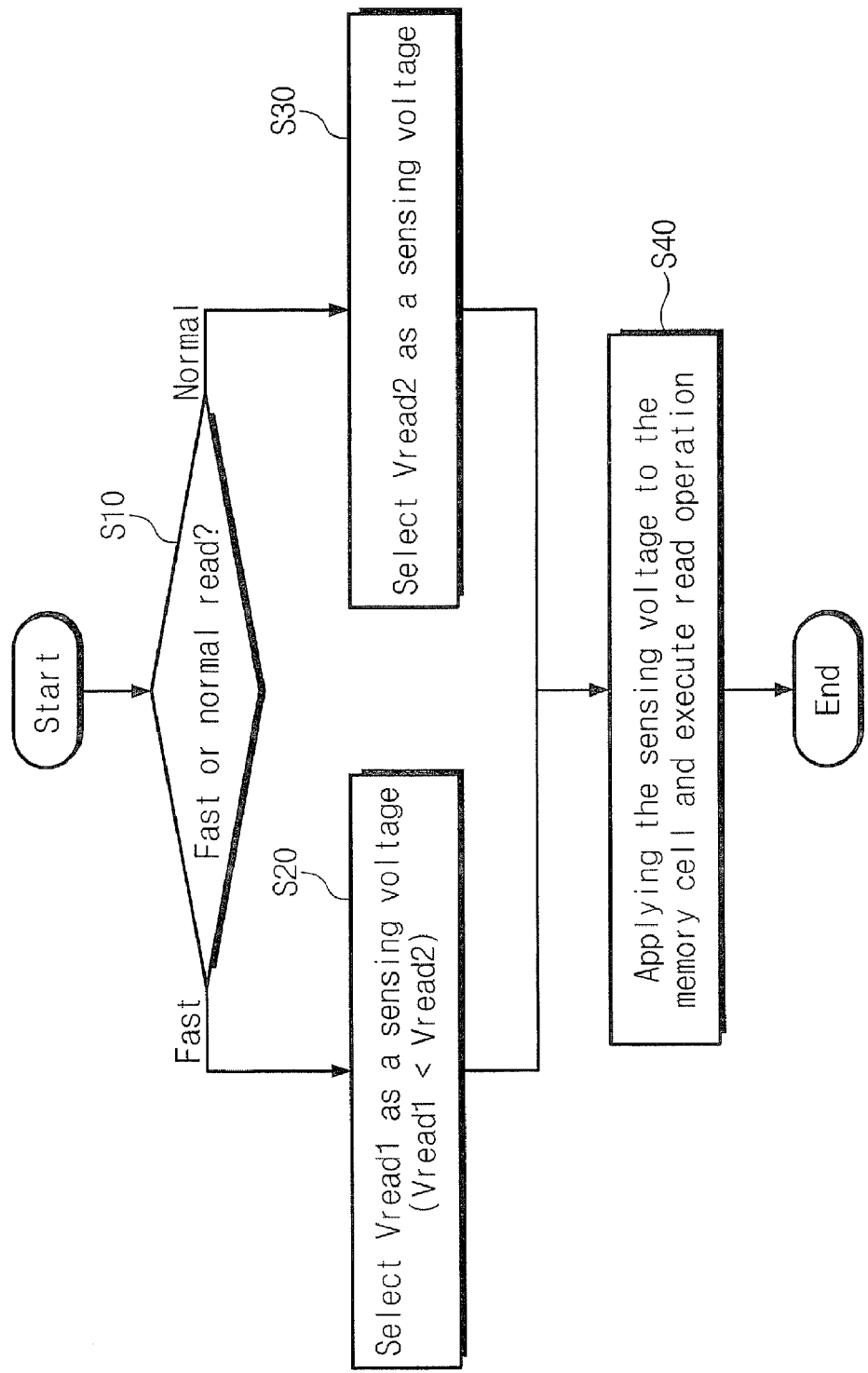
FIG. 5 is a flow chart showing reading of a phase change material according to various embodiments of the present invention.

FIG. 5 is a flow chart showing operations that can be performed to read a phase change material according to various embodiments of the present invention. Referring to FIG. 5, the case that an elapsed time Toff is relatively short is named a fast read mode, and the case that the elapsed time Toff is relatively long is named a normal read mode.

If a read operation commences, in block S10, there is judged whether it is a fast read mode or a normal read mode. For example, this judgment is able to be conducted by detecting a command in a phase change memory device. That is, a read mode for executing a write verify operation conducted in response to a write command corresponds to a fast read mode. On the other hand, a read mode conducted in response to a read command corresponds to a normal read mode. If a read operation is judged to be the fast read mode, the procedure goes to block S20, in which the first read voltage Vread1 is selected as a read voltage of a memory cell. On the other hand, if a read operation is judged to be the normal read mode, the procedure goes to block S30, in which the second read voltage Vread2 is selected as a read voltage of a memory cell. Afterwards, in block S40, the read operation may be conducted under the condition that the selected read voltage is supplied, and any one of a set state and a reset state is read out according to a sensed resistance magnitude.

in accordance with the above-described read operations, it is possible to secure a sensing margin regardless of a read point of time by varying a read voltage applied to a memory cell based upon an elapsed time Toff from a write point of time.

Figure 6A:
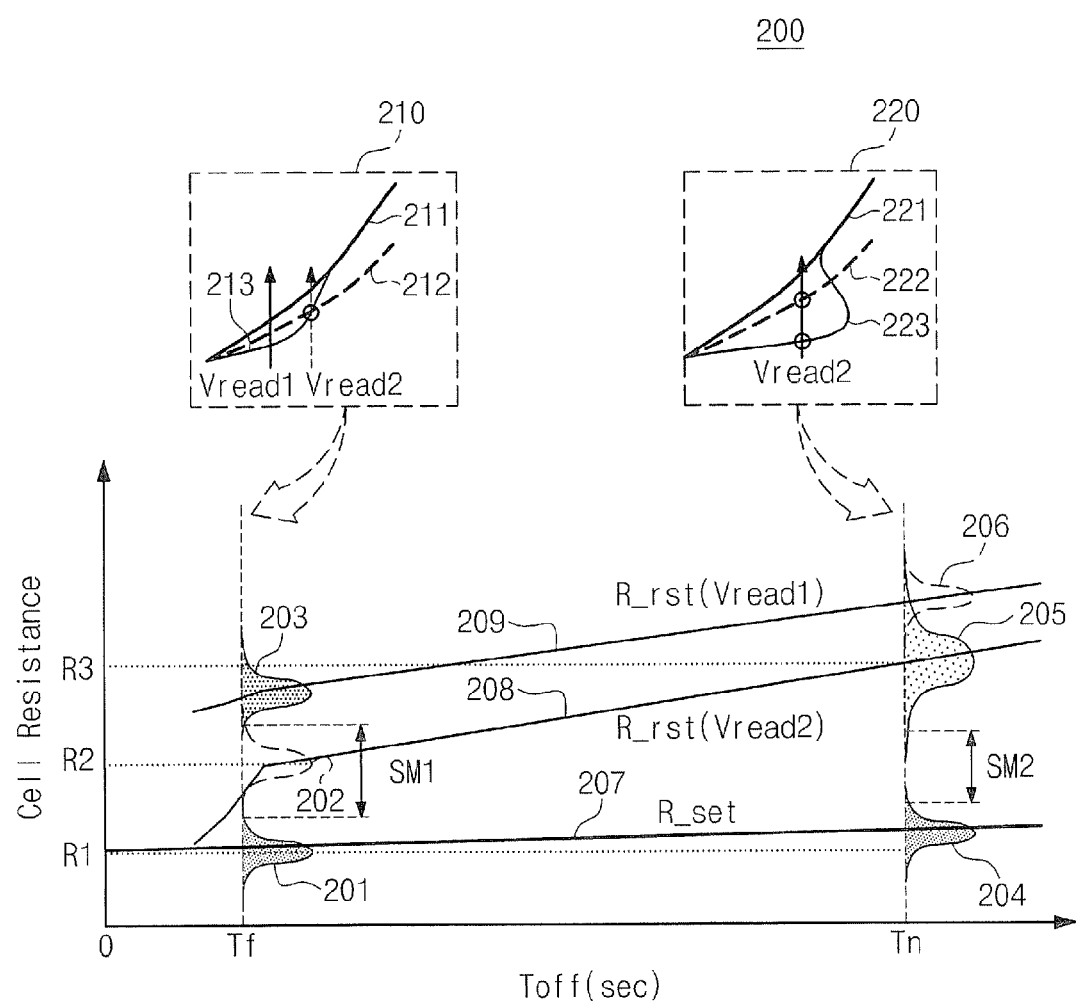
FIG. 6A is a graph showing effects according to various embodiments of the present invention.

FIG. 6A is a graph showing effects according to various embodiments the present invention. Referring to FIG. 6A, a cell resistance changed due to threshold voltage recovery and resistance drift characteristics of a resistance element 110 (refer to FIG. 4) is illustrated with respect to an elapsed time Toff. Cell resistance variation curves are illustrated with respect to a set state 207 and reset states 208 and 209, respectively. For convenience of description, there may be described the reset states 208 and 209 which are heavily affected by threshold voltage recovery and resistance drift characteristics. A resistance element programmed to a reset state may have different resistance values with respect to read voltages Vread1 and Vread2, respectively. In the case that the first read voltage Vread1 is selected as a read voltage, a resistance variation of the resistance element 110 may be measured highly as compared with the case that the second read voltage Vread2 is selected as a read voltage. That is, when the first read voltage Vread1 is supplied to the resistance element 110, a reset resistance R_rst shows a resistance distribution 203 at a short elapsed time Tf. But, if the second read voltage Vread2 is applied to the resistance element 110, the reset resistance R_rst shows a resistance distribution 202 at the short elapsed time Tf. Accordingly, a resistance distribution 203 of the reset resistance R_rst within a short elapsed time Tf has a sufficient difference from the distribution 201 of the set resistance R_set. This means that it is easy to secure a sensing margin SM1. Herein, the short elapsed time Tf is able to be applied to a point of time when the threshold voltage recovery is generated dominantly.

Resistance distributions 204, 205, and 206 show distributions of resistance values of the resistance element 110 after a write pulse is applied and a sufficient time (Tn) elapses. The resistance distribution 204 is a distribution of a set resistance R_set. It is understood from the FIG. 6A that a large variation of the resistance distribution 204 according to an elapsed time is not sensed. But, the resistance distribution 205 indicates a reset resistance R_rst sensed by use of the second read voltage Vread2. The resistance distribution 206 indicates a reset resistance R_rst sensed by use of the first read voltage Vread1. But, in the case that a sufficient elapsed time is provided, it is possible to secure a sufficient sensing margin without supplying of the first read voltage Vread1 which is relatively lower than the second read voltage Vread2. Accordingly, it is possible to supply the second voltage Vread2 as a read voltage at a normal read mode.

A graph 210 shows a current-voltage characteristic of a resistance element 110 at a point of time when an elapsed time Toff is short. A curve 211 illustrates a current-voltage characteristic in a case where the resistance element 110 is programmed to a set state, and a curve 212 illustrates a current-voltage characteristic of the resistance element 110 which has a relatively large resistance. A curve 213 illustrates a current-voltage characteristic in a case where the resistance element 110 is programmed to a reset state at a point of time when an elapsed time Toff is short. If a sensing operation is conducted with reference to the second read voltage Vread2 at a point of time corresponding to a short elapsed time, the sensing operation may be conducted at an intersection of the curves 212 and 213. Since the set and reset states have the same current value, it is difficult to secure a sensing margin. On the other hand, if a sensing operation is conducted with reference to the first read voltage Vread1 lower than the second read voltage Vread2, the curves 212 and 213 are not intersected. This means that sensing currents are different from each other. Accordingly, it is easy to secure the sensing margin.

A graph 220 shows a current-voltage characteristic of the resistance element 110 at a point of time when an elapsed time Toff is relatively sufficient. A curve 221 illustrates a current-voltage characteristic in the case that the resistance element 110 is programmed to a set state, and a curve 222 shows a current-voltage characteristic of the resistance element 110 which has a relatively large resistance value. A curve 223 indicates a current-voltage characteristic of the resistance element 110 which is programmed to a reset state at a point of time when an elapsed time Toff is relatively sufficient. If a sufficient elapsed time is provided, a sufficient sensing margin may be secured without dropping of a read voltage. That is, the curves 222 and 223 may have a sufficient current difference in a case where a sensing operation is performed with reference to the second read voltage Vread2 at a point of time Tn corresponding to a sufficient elapsed time.

As understood from the above description, the first read voltage Vread1 is provided at a read mode where there is not provided a sufficient elapsed time after providing of a write pulse. On the other hand, the second read voltage Vread2 being relatively higher than the first read voltage Vread1 is provided at a read mode which is conducted after a write pulse is provided and a sufficient time elapses. Accordingly, it is possible to realize a fast read mode such as write verification.

Figure 6B:
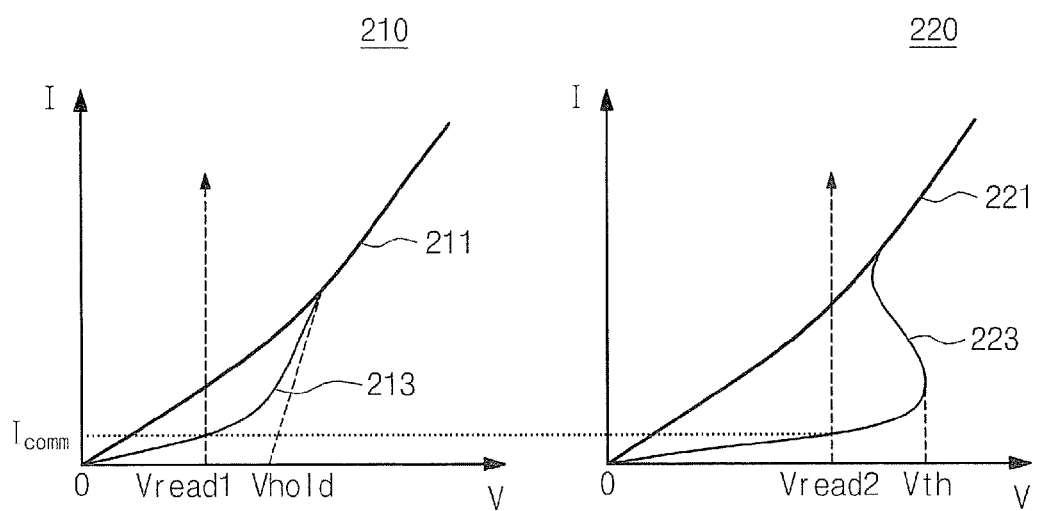
FIG. 6B is a graph showing selecting a read voltage level in accordance with various embodiments of the present invention.

FIG. 6B is a graph showing methods of selecting a read voltage level in accordance with various embodiments of the present invention. A current-voltage curve 220 of a resistance element 110 is formed at a point of time Tn when an elapsed time Toff is relatively long after providing of a write pulse. The current-voltage curve 220 shows a level of the second read voltage Vread2. The second read voltage Vread2 may be used as a read voltage which is provided to the resistance element 110 at a normal data read mode of operation. In general, the second read voltage Vread2 may be determined to have a lower value than a threshold voltage Vth. Preferably, the second read voltage Vread2 may be determined to have a value of 0.5*Vth.

A level of the first read voltage Vread1 may have a shape illustrated in a current-voltage current 210 of the resistance element 110 formed at a point of time when an elapsed time Toff is relatively short (Tf, refer to FIG. 6A) after providing of a write pulse. In accordance with a current-voltage characteristic curve 213 which corresponds to a resistance element programmed to a reset state and is measured at a short elapsed time Tf, the first read voltage Vread1 may be determined to have a lower level than a holding voltage Vhold. In particular, a level of the first read voltage Vread1 may be determined at a voltage level having the same read current as a read current Icomm generated by the second read voltage Vread2.

Figure 7:
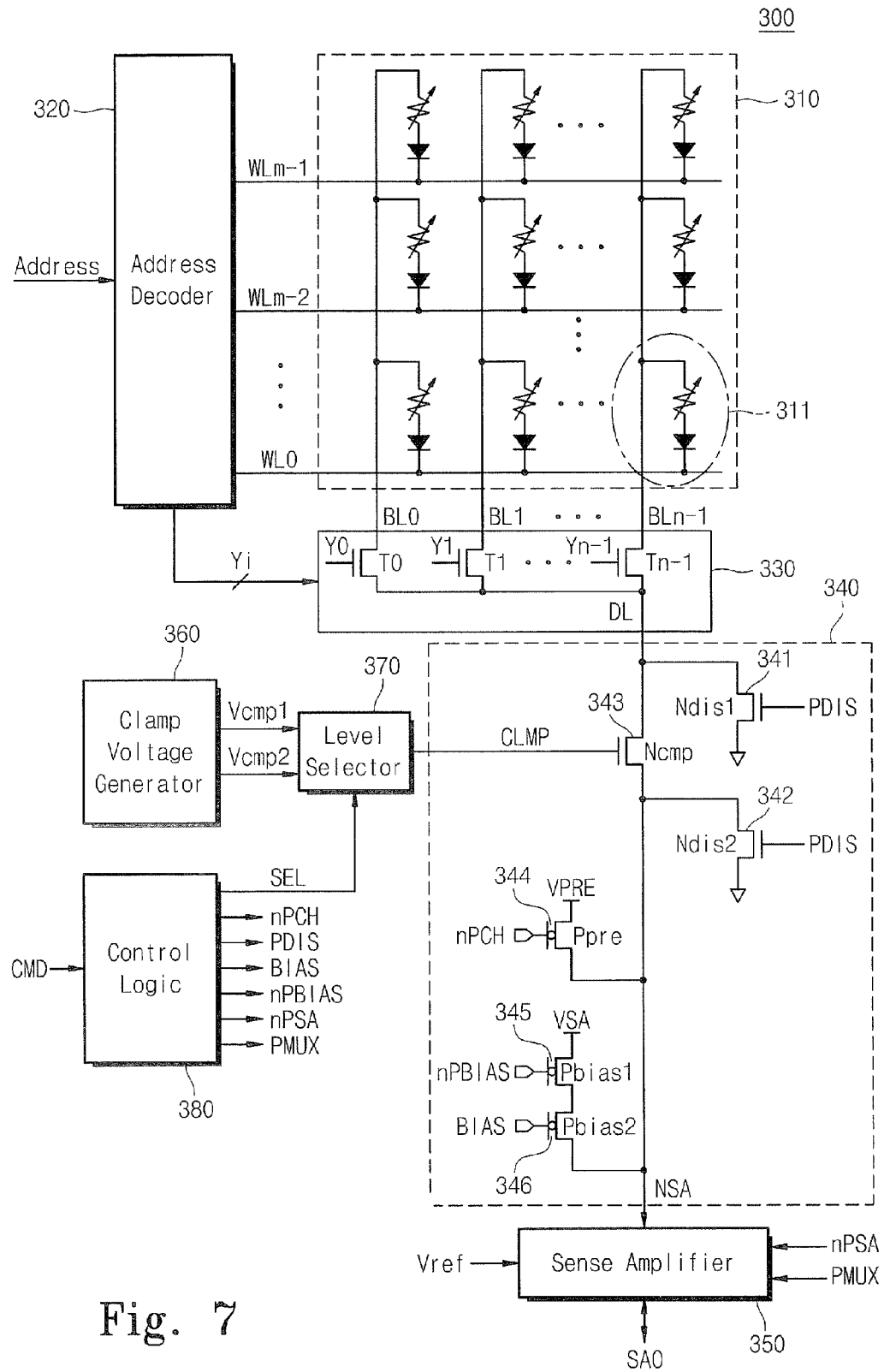
FIG. 7 is a block diagram showing a structure of a phase change memory device according to various embodiments of the present invention.

FIG. 7 is a block diagram showing a structure of a phase change memory device according to various embodiments of the present invention. Referring to FIG. 7, a phase change memory device 300 may include a cell array 310, an address decoder 320, a bit line selecting circuit 330, a sensing bias circuit 340, a sense amplifier 350, a clamp voltage generator 360, a level selector 370, and control logic 380. In these embodiments, elements 340, 360, 370 and 380 may provide a clamp circuit. With this configuration, the phase change memory device 300 may secure a sensing margin at a read mode (e.g., a verification read mode) where an elapsed time is short, by selectively providing a clamping voltage to a data line.

The cell array 310 may include a plurality of memory cells, which are connected with a plurality of word lines WL0 to WLm−1 and a plurality of bit lines BL0 to BLn−1. Each of the memory cells may include a memory element and a select element. The memory element may include a phase change material (e.g., GST) and the select element may include a diode D. In other embodiments, an NMOS transistor may be used as a select element instead of a diode.

The address decoder 120 decodes an externally applied address to select word lines and bit lines. The address may be divided into a row address for selecting word lines WL0 to WLm−1 and a column address for selecting bit lines BL0 to BLn−1. It is assumed that a memory cell 311 is selected. That is, a word line WL0 is selected, and a bit line BLn−1 is selected.

The bit line selecting circuit 330 may select bit lines in response to a select signal Yi (i=0 to n−1). The bit line selecting circuit 330 may include a plurality of NMOS transistors T0 to Tn−1. The plurality of NMOS transistors T0 to Tn−1 may connect the bit lines BL0 to BLn−1 to a data line DL. For example, when a select signal Yn−1 is enabled, the data line DL is electrically connected with a bit line BLn−1.

The sensing bias circuit 340 may supply a sensing current to a memory cell at pre-charge, discharge, and sensing operations of a sensing node NSA in order to support a sensing operation of the sense amplifier 350. The sensing bias circuit 340 may include the first and second discharge circuits 341 and 342, a clamping device 343, a pre-charge circuit 344, and a bias circuit 345 and 346. The first discharge circuit 341 is connected between the data line DL and a ground terminal and discharges the data line DL. The second discharge circuit 342 is connected between the sensing node NSA and the ground terminal and discharges the sensing node NSA. The first discharge circuit 341 comprises an NMOS transistor Ndis1 which forms a current path between the data line DL and the ground terminal, and discharges the data line in response to a discharge signal PDIS. Likewise, the second discharge circuit 342 comprises an NMOS transistor Ndis2 and discharges the sensing node NSA in response to the discharge signal PDIS. The discharge signal PDIS may be provided from the control logic 380.

The clamping device 343 may clamp a voltage of the data line into a given voltage level at a read operation. This is to prevent a voltage level of a selected bit line BLn−1 from being increased over a threshold voltage of the resistance element 110 (GST). For example, assuming that a threshold voltage of a diode is 0.5V and a threshold voltage of a resistance element 110 is 1V, a voltage of the bit line BLn−1 may be clamped into a voltage (e.g., 1V) lower than 1.5V. The clamping device 343 comprises an NMOS transistor Ncmp forming a current path between the sensing node NSA and the data line DL and clamps a voltage level of the data line DL in response to a clamp signal CLMP. For example, assuming that a threshold voltage of the NMOS transistor Ncmp is 0.5V and the clamp signal CLMP has a voltage level of 1.5V, a voltage level of the data line DL may be clamped into about 1V. At this time, a voltage level of a selected bit line BLn−1 is also clamped into about 1V. With the present phase change memory device 300, the clamp signal CLMP may have one of different voltage levels via the clamp voltage generator 360 and the level selector 370. That is, the clamp signal CLMP may have the first clamp voltage Vcmp1 at a fast read operation such as a verification read operation and the second clamp voltage Vcmp2 at a normal data read operation. Herein, the first clamp voltage Vcmp1 is relatively lower than the second clamp voltage Vcmp2. With the above description, a sensing margin is sufficiently provided even at a fast read mode of operation. On all occasions, the clamp signal CLMP may be fixed to a DC voltage at a read operation.

The pre-charge circuit 344 may pre-charge the sensing node NSA with a pre-charge voltage VPRE at a sensing operation of the sense amplifier 350. At this time, a selected bit line BLn−1 may be pre-charged with the clamping voltage (e.g., 1V). The pre-charge circuit 344 is connected between a power terminal and the sensing node NSA, receives the pre-charge voltage VPRE via the power terminal, and pre-charges the sensing node NSA with the pre-charge voltage VPRE in response to a pre-charge signal nPCH. The pre-charge signal nPCH may be provided from the control logic 380. The pre-charge circuit 344 is formed of a PMOS transistor Ppre, which has a gate receiving the pre-charge signal nPCH, a source receiving the pre-charge voltage VPRE, a drain connected to the sensing node NSA, and a bulk (not shown) receiving a boosting voltage VSA.

The bias circuit 345 and 346 is connected between the power terminal and the sensing node NSA and supplies a read current to a selected bit line BLn−1. The bias circuit 345 and 346 receives the boosting voltage VSA via the power terminal, and is formed of two serially-connected PMOS transistors Pbias1 and Pbias2. The first PMOS transistor Pbias1 is connected between the power terminal and the second PMOS transistor Pbias2 and is controlled by the first bias signal nPBIAS. Herein, the first bias signal nPBIAS may be provided from the control logic 380. The second PMOS transistor Pbias2 is connected between the first PMOS transistor Pbias1 and the sensing node NSA and is controlled by the second bias signal BIAS. Herein, the second bias signal BIAS is provided from the control logic 380 and may have a given DC voltage at a read operation. The bias circuit 345 and 346 may supply a read current to a selected bit line BLn−1 when the first bias signal nPBIAS is at a low level state.

The sense amplifier 350 compares a voltage of the sensing node NSA with a reference voltage Vref to output a comparison result value SAO, at a read operation. Herein, the reference voltage Vref may be provided from a reference voltage generating circuit (not shown). The sense amplifier 350 may perform a sensing operation using the boosting voltage VSA. The sense amplifier 350 receives control signals nPSA and PMUX from the control logic 380 at a sensing operation.

The clamp voltage generator 360 may generate a plurality of clamp voltages Vcmp1 and Vcmp2. The level selector 370 may select one of the first and second clamp voltages Vcmp1 and Vcmp2 in response to a select signal SEL from the control logic 380 and output the selected clamp voltage as the clamping signal CLMP. Herein, levels of the first and second clamp voltages Vcmp1 and Vcmp2 may be determined considering a read current provided by the bias circuit 345 and 346. In exemplary embodiments, the first clamp voltage Vcmp1 may be determined to generate a read current of the same size as a read current which flows via the resistance element 110 at a point of time when the second clamp voltage Vcmp2 is provided. Via the clamp voltage generator 360 and the level selector 370, the clamp signal CLMP may be provided with the first clamp voltage Vcmp1 at a fast read operation such as a verification read operation and with the second clamp voltage Vcmp2, higher than the first clamp voltage Vcmp1, at a normal data read mode, Accordingly, it is possible to perform a write verify operation rapidly after a write operation without reduction of a sensing margin.

The control logic 380 may output control signals SEL, PDIS, nPBIAS, BIAS, nPCH, nPSA, and PMUX in response to an externally provided command CMD. In particular, the control logic 380 detects the command CMD and outputs the select signal SEL to the level selector 370 so as to select the first clamp voltage Vcmp1 at a fast read mode (e.g., a write verification read operation). In this case, the command CMD may correspond to a write command. On the other hand, at a normal read mode for outputting data to the external, that is, when a read command is received, the control logic 380 outputs the select signal SEL so as to select the second clamp voltage Vcmp2. waveforms of the control signals SEL, PDIS, nPBIAS, BIAS, nPCH, nPSA, and PMUX provided from the control logic 380 will be more fully described with reference to FIG. 8.

With the above description, phase change memory devices 300 according to various embodiments of the present invention can control a level of the clamp signal CLMP to provide different read voltages with respect to a fast read mode (or, a verification read mode) and a normal read mode. Accordingly, it is possible to provide a sufficient sensing margin with an elapsed time Toff (an elapsed time after a write operation) being reduced. This means that write and read operations can be performed in a high speed.

Figure 8:
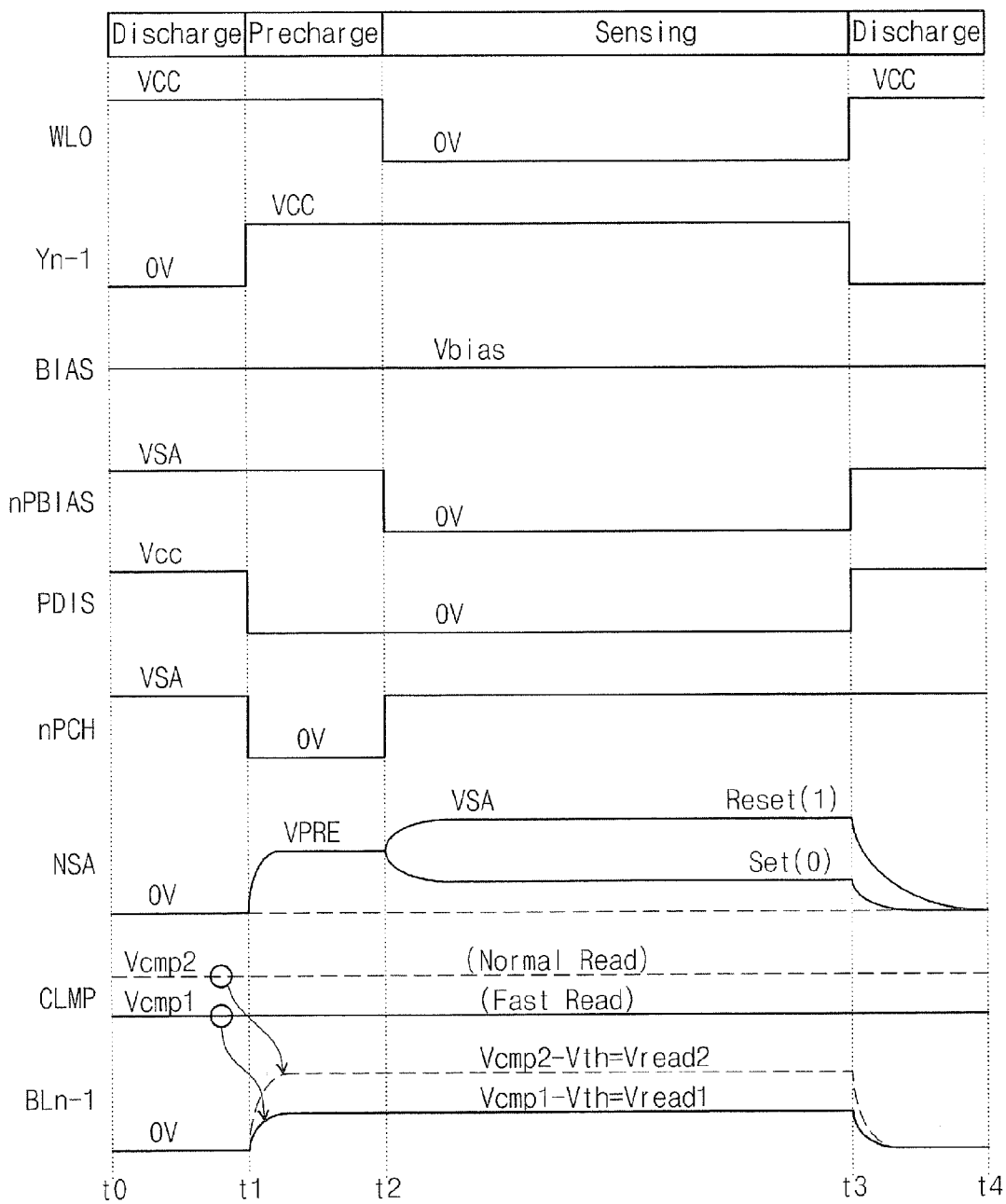
FIG. 8 is a timing diagram showing reading of a phase change memory device in FIG. 7.

FIG. 8 is a timing diagram showing read operations of a phase change memory device in FIG. 7. A read operation of a phase change memory device 300 may be divided into a discharge period t0-t1, a pre-charge period t1-t2, a sensing period t2-t3, and a discharge period t3-t4. For convenience of description, a read operation for a memory cell 311 (refer to FIG. 7) will be described. Herein, a clamp signal CLMP may have the first clamp voltage Vcmp1 at a fast read mode and the second clamp voltage Vcmp2 at a normal read mode through all periods t0-t4.

During the discharge period t0-t1, a data line DL and a sensing node NSA are discharged to a ground level. Referring to FIG. 7, since a select signal Yn−1 is at a low level state, the bit line BLn−1 and the data line DL are electrically disconnected. Since a discharge signal PDIS is at a high level, the data line DL and the sensing node NSA are discharged to a ground level. Further, since the first bias signal nPBIAS is at a high level, the first PMOS transistor Pbias1 of a bias circuit 345 and 346 is turned off. The reason that the bit line BLn−1 remains at a ground level is because the bit line BLn−1 is discharged by a bit line discharge circuit (not shown) installed on the bit line BLn−1.

In the pre-charge period t1-t2, the sensing node NSA is pre-charged with a pre-charge voltage VPRE, and the bit line BLn−1 is pre-charged with a read voltage Vread1 or Vread2. Referring to FIG. 7, the select signal Yn−1 is at a high level, the discharge signal PDIS is at a low level, and a pre-charge signal nPCH is at a low level. When the select signal Yn−1 goes to a high level, the bit line BLn−1 and the data line DL are electrically connected. When the discharge signal PDIS goes to a low level, NMOS transistors Ndis1 and Ndis2 of the discharge circuits 341 and 342 are turned off. In a case where the pre-charge signal nPCH goes to a low level, the sensing node NSA is pre-charge with the pre-charge voltage VPRE. When the sensing node NSA is pre-charge with the pre-charge voltage VPRE, a voltage of the bit line BLn−1 is increased up to a read voltage Vread1 or Vread2.

In the sensing period t2-t3, a word line WL0 is set to a low level. At this time, a voltage level of the sensing node NSA may be changed according to a state of the memory cell 311. Further, in the sensing period t2-t3, the first bias signal nPBIAS is set to a low level. As the first bias signal nPBIAS is set to a low level, a read current is provided to the memory cell 311 via a bias circuit 345 and 346.

If the memory cell 311 stores a reset state or data '1', a voltage level of the sensing node NSA increases to a boosting voltage VSA from the pre-charge voltage VPRE. Since a read current is supplied via the bias circuit 345 and 346, a voltage of the sensing node NSA increases up to the boosting voltage VSA. In a case where the memory cell 311 stores a set state or data '0', a voltage level of the sensing node NSA decreases to a clamp voltage Vcmp1 or Vcmp2 from the pre-charge voltage VPRE. Herein, the voltage level of the sensing node NSA is dropped not to a ground level GND but to the clamp voltage Vcmp1 or Vcmp2 due to a threshold voltage of a diode. Under this condition, a sense amplifier 350 performs a sensing operation.

During the discharge period t3-t4, the word line WL0 is set to a high level, the select signal Yn−1 goes to a low level, and the discharge signal PDIS is set to a high level. When the select signal Yn−1 is set to a low level, the bit line BLn−1 and the data line DL are electrically disconnected. If the discharge signal PDIS goes to a high level, the sensing node NSA goes to a ground level.

With the above-described reading, a sensing margin can be sufficiently provided even at a verification read operation where an elapsed time after supplying of a write pulse is relatively short. Further, a verification read operation is able to be conducted before a write pulse is provided and a threshold voltage recover is sufficiently done. That is, in a case where a level of the first clamp voltage Vcmp1 is selected appropriately, it is possible to a verification read operation at a time shorter than a conventional elapsed time from supplying of a write pulse without reducing of a sensing margin. Accordingly, a high-speed and high-reliability write operation is performed.

Figure 9:
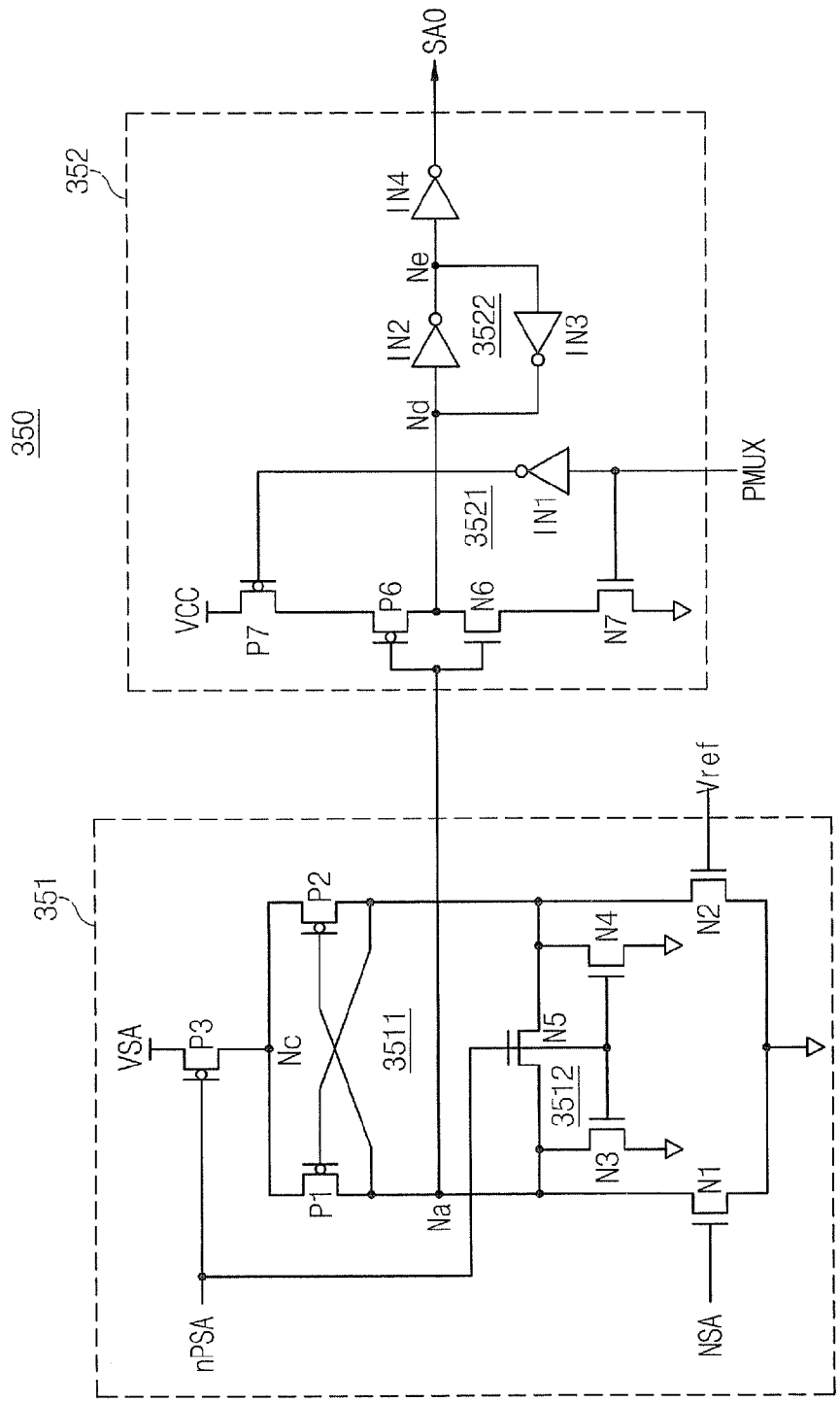
FIG. 9 is a circuit diagram showing a structure of a sense amplifier in FIG. 7.

FIG. 9 is a circuit diagram showing a structure of a sense amplifier in FIG. 7. A sense amplifier 350 compares a voltage of a sensing node NSA with a reference voltage Vref to output a sensing result value SAO. The sense amplifier 350 receives a boosting voltage VSA and performs a sensing operation in response to control signals nPSA and PMUX. Referring to FIG. 9, the sense amplifier 350 may include a sensing part 351 and a latch part 352.

The sensing part 351 may include a plurality of PMOS transistors P1 to P3 and a plurality of NMOS transistors N1 to N5. The sensing part 351 has a differential amplifier 3511 and an equalizer 3512. The differential amplifier 3511 receives the boosting voltage VSA and senses and amplifies a difference between a voltage of the sensing node NSA and the reference voltage Vref. The equalizer 3512 equalizes output nodes Na and Nb of the differential amplifier 3511 in response to the control signal nPSA.

The differential amplifier 3511 has the first and second NMOS transistors N1 and N2 and the first, second, and third PMOS transistors P1, P2, and P3. The first NMOS transistor N1 forms a current path between the first node Na and a ground in response to a voltage of the sensing node NSA. The second NMOS transistor N2 forms a current path between the second node Nb and a ground in response to the reference voltage Vref. The first PMOS transistor P1 forms a current path between the third node Nc and the first node Na in response to a voltage of the second node Nb. The second PMOS transistor P2 forms a current path between the second node Nc and the second node Nb in response to a voltage of the first node Na. The third PMOS transistor P3 forms a current path between a power terminal and the third node Nc in response to the control signal nPSA. The third PMOS transistor P3 receives the boosting voltage VSA via the power terminal.

The equalizer 3512 includes the third, fourth, and fifth NMOS transistors N3, N4, and N5. The third NMOS transistor N3 is connected between the first node N1 and a ground, the fourth NMOS transistor N4 is connected between the second node Nb and a ground, and the fifth NMOS transistor is connected between the first node Na and the second node Nb. The third to fifth NMOS transistors N3 to N5 are simultaneously turned on or off in response to the control signal nPSA.

The latch part 352 is connected to the first node Na of the sensing part 351 and outputs a sensing result SAO in response to the control signal PMUX. The latch part 352 has an inverting circuit 3521 and a latch circuit 3522. The inverting circuit 3521 is connected between the first node Na and the latch circuit 3522 and operates responsive to the control signal PMUX. The inverting circuit 3521 has the sixth and seventh PMOS transistors P6 and P7, the sixth and seventh NMOS transistors N6 and N7, and the first inverter IN1. When the control signal PMUX is at a high level, the inverting circuit 3521 inverts a voltage level of the first node Na. The latch circuit 3522 includes the second and third inverters IN2 and IN3.

Figure 10:
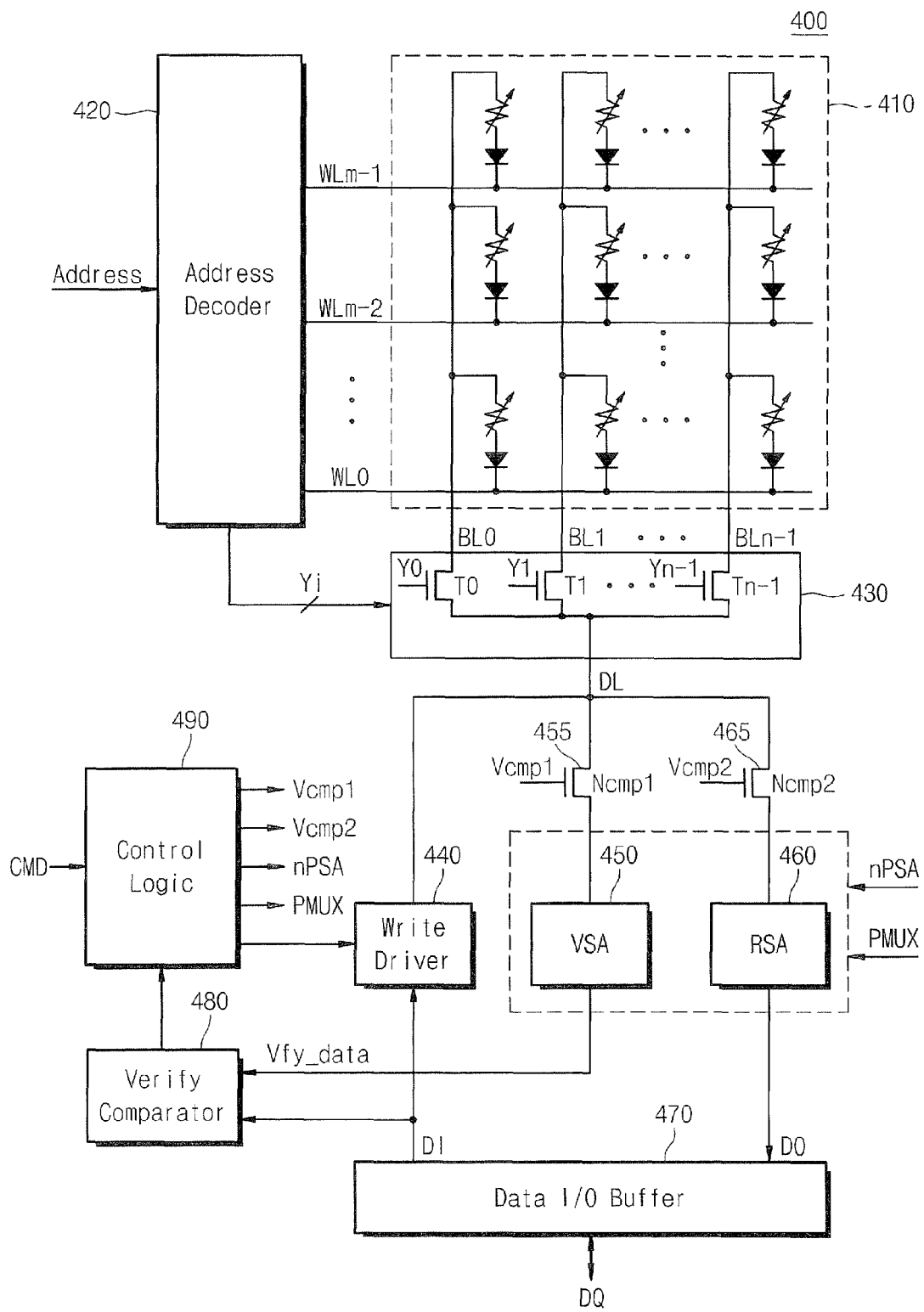
FIG. 10 is a block diagram showing a structure of a phase change memory device according to other embodiments of the present invention.

FIG. 10 is a block diagram showing a structure of a phase change memory device according to other embodiments of the present invention. Referring to FIG. 10, phase change memory devices according to these embodiments may have a sense amplifier 450 for verification read and a sense amplifier 460 for data read, respectively. Thus, the sense amplifiers 450 and 460 may each be supplied with clamp voltages Vcmp1 and Vcmp2 for clamping bit lines at a point of time when each of the sense amplifiers 450 and 460 are activated. The clamp circuit may be provided by elements 455, 465, 440 and 490 in these embodiments.

A cell array 410 may include memory cells each of which stores N-bit data information (N being one or more integer). A plurality of memory cells are arranged on the cell array 410 in rows (or, word lines) and columns (or, bit lines). Each of the memory cells may include a switch element and a resistance element. The switch element may be implemented with one of various elements such as MOS transistors, diodes, and the like. The resistance element may include a variable resistance substance formed of the above-described GST material.

An address decoder 420 may decode an externally applied address. Herein, the address may include a row address and a column address. The address decoder 420 may select a word line WL according to the row address and a bit line BL according to the column address. As a result of the address decoding, the address decoder 420 may provide a column selection signal Yi to a bit line selecting circuit 430.

The bit line selecting circuit 430 is connected to the memory cell array 410 via the bit line BL and to a write driver circuit 440 via a data line DL. The bit line selecting circuit 430 connects the data line DL and the bit line BL in response to the column selection signal Yi.

The write driver 440 may supply write current that is used to store write data in a selected memory cell. The write driver 440 may output write current I_SET or I_RST in response to the write data. The write current I_SET or I_RST may be supplied to a bit line of a selected memory cell via the data line DL and the bit line selecting circuit 430. The write driver 440 may continue to supply the write current which is increased until a verification operation for a selected memory cell is judged to be verification pass.

The sense amplifier 450 for verification read is controlled by the control logic 490 and is used to sense whether data is normally written via the write driver 440. The sense amplifier 450 for verification read according to the present invention may sense and amplify data of a selected memory cell in response to the control of the control logic 480. The sense amplifier 450 for verification read may sense and latch data via a bit line of a selected memory cell in response to control signals nPSA and PMUX from the control logic 490. If a write command is detected, the control logic 490 may generate the first clamp voltage Vcmp1. Thus, the first clamp device 455 is turned on, so that the sense amplifier 450 for verification read is connected with a selected memory cell. But, the first clamp voltage Vcmp1 is inactivated at a normal data read mode. The sense amplifier 450 for verification read may provide a verify comparator 480 with a verification result Vfy_data sensed by the first clamp voltage Vcmp1.

The sense amplifier 460 for data read may sense data from a memory cell via a bit line which is selected the bit line selecting circuit 430 at a normal read operation. If a read command for normal data is detected, the control logic 490 may activate the second clamp voltage Vcmp2. Thus, the first clamp device 455 is cut off, and the second clamp device 465 is turned on. Data of a memory cell sensed by the second clamp voltage Vcmp2 may be sent to a data input/output buffer 470 as output data DO.

The data input/output buffer 470 may provide externally applied input data DI to the write driver 440 and the verify comparator 480. The data input/output buffer 470 may provide data read out by the sense amplifier 460 for data read to the external.

The verify comparator 480 may compare verification data Vfy_data from the sense amplifier 450 for verification read with input data DI from the data input/output buffer 470. The verify comparator 480 may output a pass/fail signal P/F according to a comparison result of the verification data Vfy_data and the input data DI. The pass/fail signal P/F indicates whether write data is normally written. If the verification data Vfy_data and the input data DI are detected to be identical with each other, the verify comparator 480 may output verification pass. On the other hand, if the verification data Vfy_data and the input data DI are detected to be different from each other, the verify comparator 480 may output verification fail.

The control logic 490 may detect a command CMD and generate control signals nPSA and PMUX and the first and second clamp voltages Vcmp1 and Vcmp2. The control signals nPSA and PMUX are used to select the sense amplifier 450 for verification read or the sense amplifier 460 for data read. If a write command is detected, the control logic 490 generates the first clamp voltage Vcmp1. This means that the sense amplifier 450 for verification read is activated. If a read command is detected, the control logic 490 generates the second clamp voltage Vcmp2. This means that the sense amplifier 460 for data read is activated. The first and second clamp voltages Vcmp1 and Vcmp2 may have the same levels as those described in FIG. 7.

As understood from the above description, phase change memory devices 400 according to various embodiments of the present invention may be configured such that different sense amplifiers are activated at a write verification operation and a data read operation. As clamp voltages of different levels are provided at each mode, the phase change memory devices 400 according to various embodiments of the present invention may provide constant sensing margin regardless of an elapsed time from a point of time when a write pulse is provided. Accordingly, it is possible to remarkably improve a write speed of a phase change memory device that adopts a program scheme of a write-write verify manner to improve the reliability.

Figure 11:
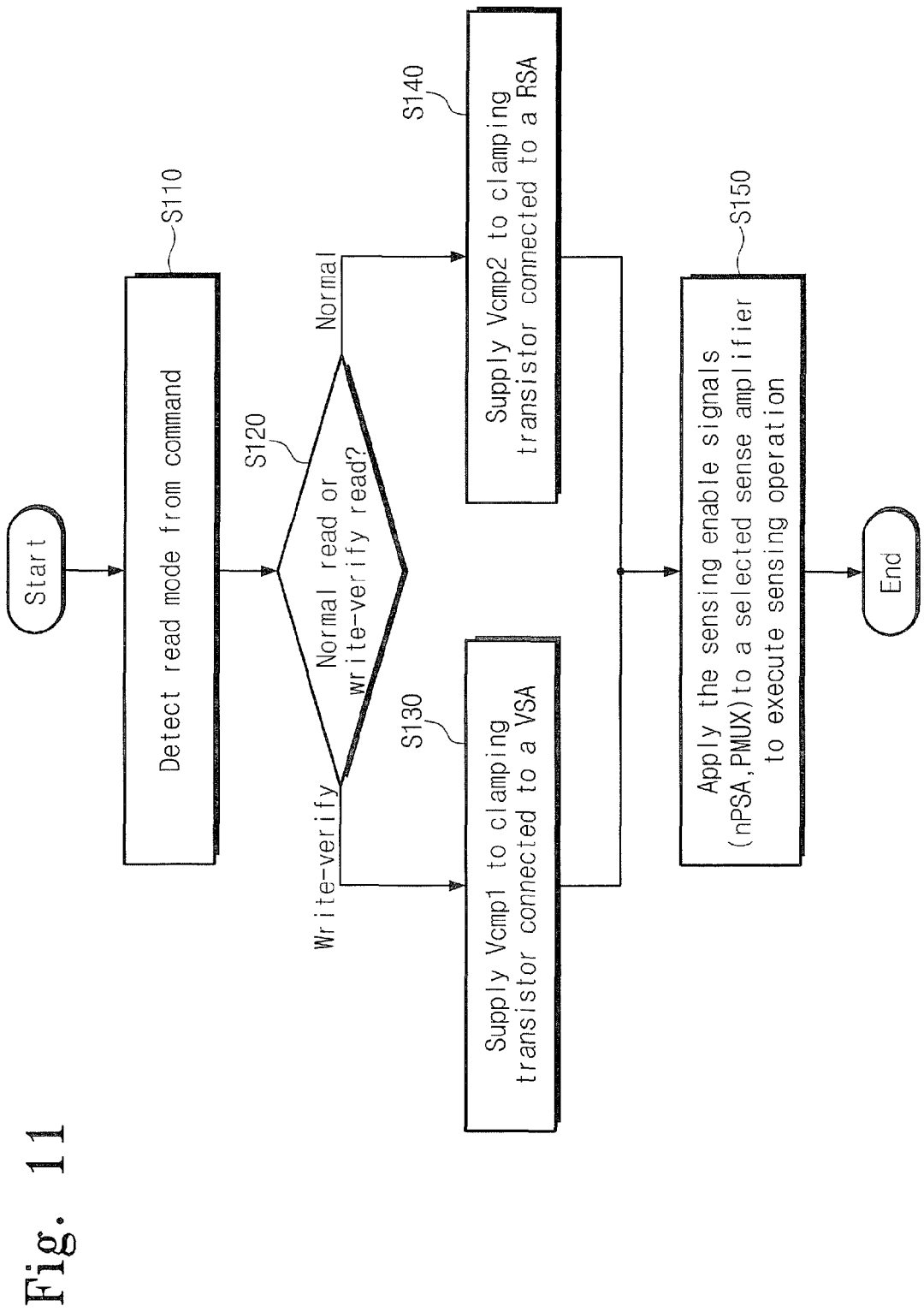
FIG. 11 is a flow charge showing reading of a phase change memory device in FIG. 10.

FIG. 11 is a flow charge showing reading of a phase change memory device in FIG. 10. Referring to FIG. 11, there is illustrated operations for providing different clamp voltages at a normal read operation for sensing normal data and at a verification read operation where reading is made after a short elapsed time from a point of time when a write pulse is provided.

In block S110, the control logic 490 may detect whether an input command CMD is a write command or a read command. The control logic 490 may select a read mode of operation via the detected command. In block S120, the control logic 490 may control so as to select a clamp voltage in a verification read manner when a write command is input and a normal read mode when a read command is input. In case of the write verification read mode, in block S130, the control logic 490 generates the first clamp voltage Vcmp1 to activate a sense amplifier 450 for verification read. In case of the normal read mode, in block S140, the control logic 490 generates the second clamp voltage Vcmp2 to activate a sense amplifier 460 for data read. The control logic 490 may output control signals nPSA and PMUX such that data sensing and latching operations are conducted via an activated sense amplifier under a selected clamp voltage.

Figure 12:
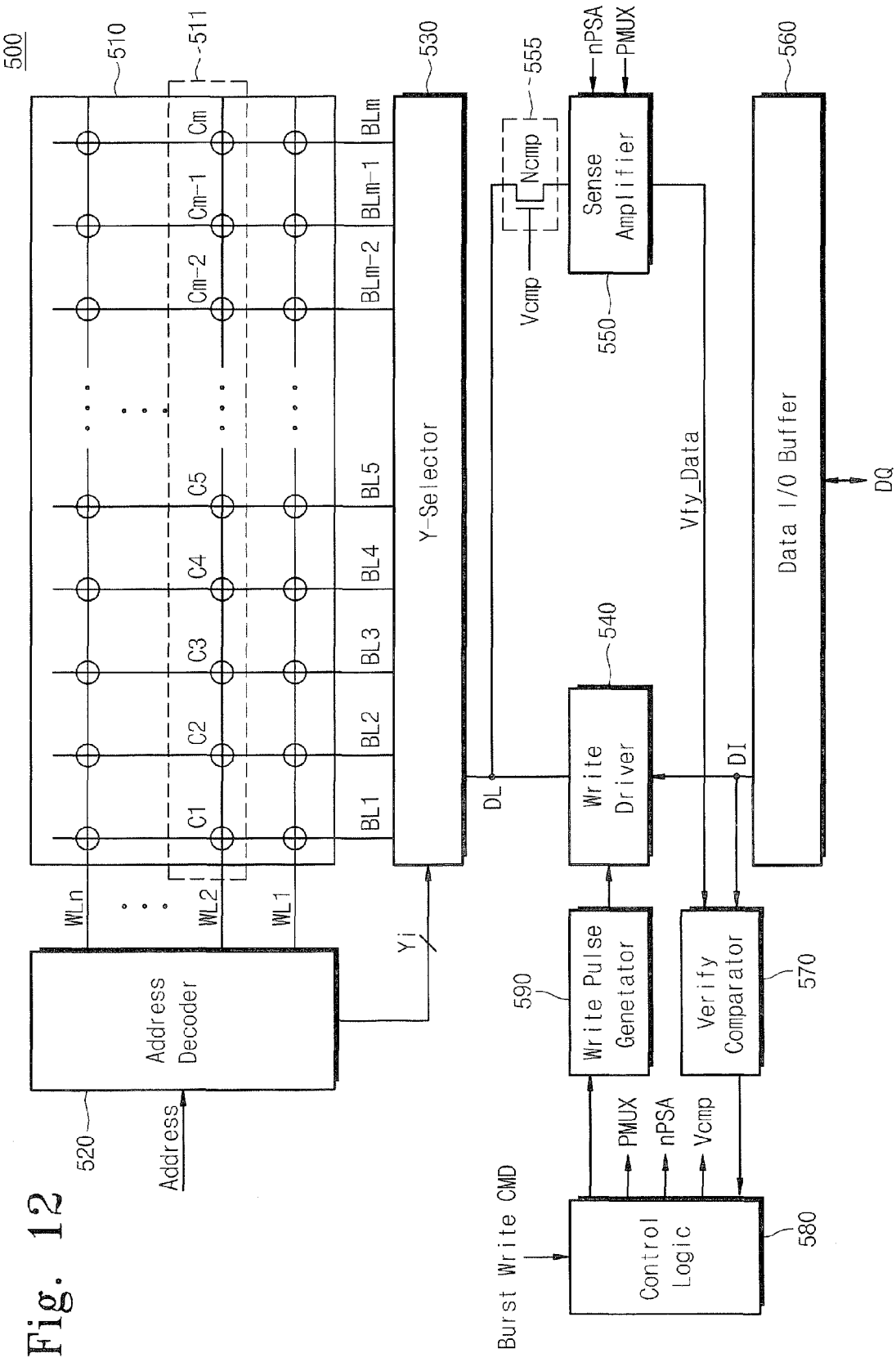
FIG. 12 is a block diagram showing a structure of a phase change memory device according to other embodiments of the present invention.

FIG. 12 is a block diagram showing a structure of a phase change memory device according to various other embodiments of the present invention. Referring to FIG. 12, a phase change memory device 500 according to these embodiments of the present invention may better a write speed even in the case that a write-verification read operation is conducted in a burst mode. That is, improved write speed may be provided via the above-described clamp voltage control manner even in the case that a plurality of memory cells is successively programmed and a verification operation is conducted successively.

A cell array 510 may include a plurality of memory cells, which are connected with a plurality of word lines WL1 to WLn and a plurality of bit lines BL1 to BLm. Each memory cell may include a memory element and a select element as illustrated in FIG. 10. In a burst mode, a plurality of write-verification loops is conducted until all memory cells are normally written. All memory cells may be programmed within each write-verification loop. Or, two (×2), four (×4), or eight (×8) memory cells may be programmed within each write-verification loop. It is assumed that a unit of a write-verification loop, for example, is a word line WL2. If a burst write operation commences, a verification read pulse for each of memory cells C1 to Cm may be provided sequentially following successive supplying of a write pulse for each of the memory cells C1 to Cm. Thus, an elapsed time Toff when a read pulse is supplied after supplying of a write pulse may differentiate at the memory cell C1 and the memory cell Cm. Thus, memory cells may have different sensing margins due to the resistance drift. The write-verification read loop is directed to make a resistance distribution of programmed memory cells become tight. In particular, in order to drive a phase change memory cell as a multi-level cell, the write-verification read scheme may be used. But, at the above burst mode, a resistance difference between memory cells written at the same loop may have a bad influence to reduce a resistance distribution of memory cells. A difference of sensing margins of memory cells caused at the above-described verification read operation means reduction of a sensing margin since there is considered a bias condition of a read operation on the basis of a minimum sensing margin. Reduction of the sensing margin may be compensated via reduction of the speed of a burst write operation. But, phase change memory devices 500 according to various embodiments of the present invention may compensate for reduction of the sensing margin due to the threshold voltage recovery and the resistance drift by controlling a clamp voltage Vcmp at a burst write mode.

An address decoder 520 may decode an externally input address, which may include a row address and a column address. The address decoder 520 may select a word line WL based on the row address and a bit line BL based on the column address. As a result of the address decoding, the address decoder 520 may provide a column selection signal Yi to a bit line selecting circuit 530.

The bit line selecting circuit 530 is connected with the cell array 510 via the bit line BL and with a write driver circuit 540 via a data line DL. The bit line selecting circuit 530 electrically connects the data line DL and the bit line BL in response to the column selection signal Yi.

The write driver 540 responds to write pulses from a pulse generator 590 to provide write current for writing write data in a selected memory cell. The write driver 540 may output write current I_SET or I_RST in response to write data DI. The write current I_SET or I_RST may be sent to a bit line of a selected memory cell via the data line DL and the bit line selecting circuit 530. The write driver 540 may continue supplying of write current increased until a verification operation for a selected memory cell is judged to be verification pass. The sense amplifier 550 is controlled by the control logic 580 and senses whether data is normally written via the write driver 540. The sense amplifier 550 according to various embodiments of the present invention may sense and amplify data of a selected memory cell in response to the control of the control logic 580. The sense amplifier 550 may sense and latch data via a bit line of a selected memory cell in response to control signals nPSA and PMUX from the control logic 580. In a burst write mode, the control logic 580 may generate the first clamp voltage Vcmp1 lower than a clamp voltage provided at a normal data read mode. The first clamp voltage Vcmp1 may be lower than the second clamp voltage Vcmp2 provided at a normal data read mode. A level of the first clamp voltage Vcmp1 may be selected as a read voltage which leads generation of the same read current as read current sensed in the case that the second clamp voltage Vcmp2 is provided. If a clamp device 555 is turned on, a bit line is fixed to a read voltage that corresponds to a difference between the first clamp voltage Vcmp1 and a threshold voltage of a transistor Ncmp. Thus, the sensing margins of memory cells may be increased as a read voltage is reduced. If the transistor Ncmp is turned on by the first clamp voltage Vcmp1, a selected memory cell is connected with the sense amplifier 550.

The sense amplifier 550 may provide a verify comparator 570 with a verification result Vfv_data sensed by the first clamp voltage Vcmp1. Thus, in these embodiments, a clamp circuit may be provided by elements 540, 555, 580 and 590.

A data input/output buffer 560 may supply externally applied input data DI to the write driver 540 and the verify comparator 570.

The verify comparator 570 compares the verification data Vfy_data from the sense amplifier 550 with the input data DI from the data input/output buffer 560. The verify comparator 570 may output a pass/fail signal P/F, indicating whether write data is normally written, based upon a comparison result of the verification data Vfy_data and the input data. If the verification data Vfy_data and the input data DI are judged to be identical with each other, the verify comparator 570 may output verification pass. On the other hand, if the verification data Vfy_data and the input data DI are judged to be different with each other, the verify comparator 570 may output verification fail.

The control logic 580 may detect a burst write command to generate the control signals nPSA and PMUX to the sense amplifier 550 and the first clamp voltage Vcmp1 or the second clamp voltage Vcmp2 to the clamp device 555. When a burst write command is detected, the control logic 580 provides the first clamp voltage Vcmp1 to activate the sense amplifier 550. On the other hand, if a read command is detected, the control logic 580 provides the second clamp voltage Vcmp2 to activate the sense amplifier 550. The first clamp voltage Vcmp1 and the second clamp voltage Vcmp2 may be selected to have substantially the same levels as those described in FIG. 7.

The write pulse generator 590 may provide the write driver 540 with write pulses for programming memory cells to a set or reset state, in response to the control of the control logic 590. The write driver 540 may generate write current I_SET or I_RST in response to write pulses.

The above-described phase change memory device 500 may increase the sensing margin by providing the first clamp voltage even at a burst write operation.

Figure 13:
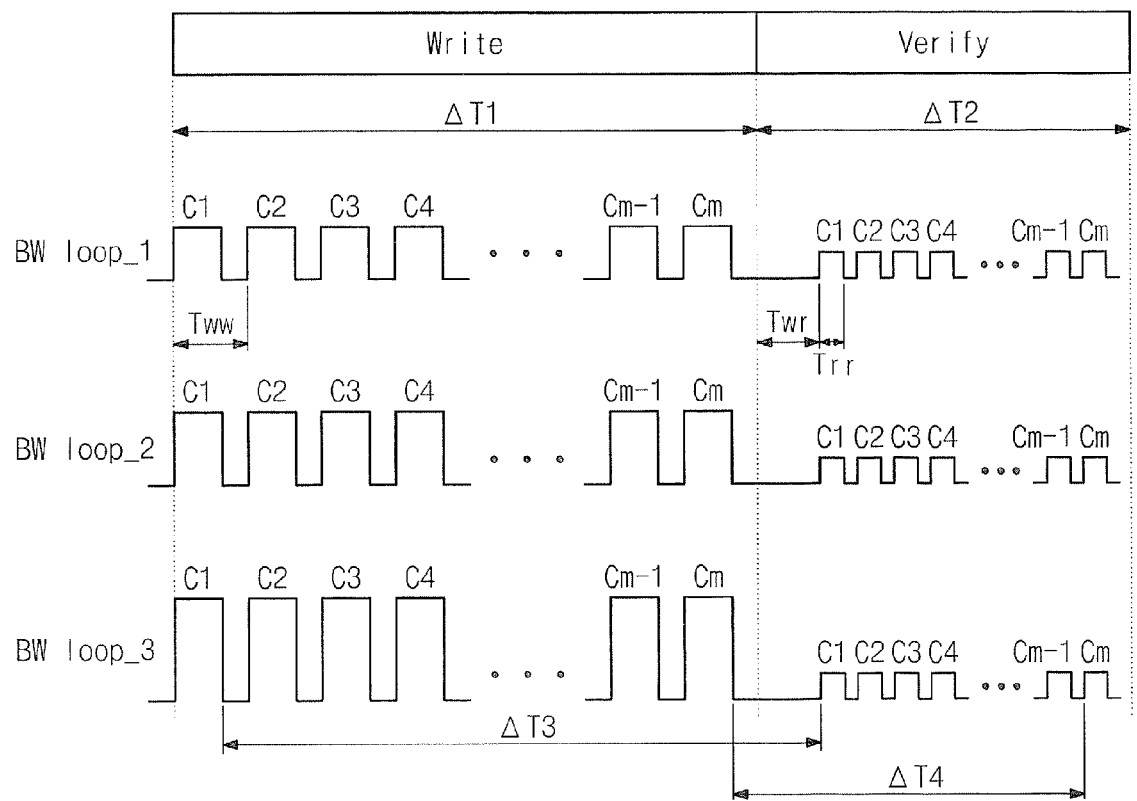
FIG. 13 is a waveform diagram showing a burst write operation of a phase change memory device in FIG. 12.

FIG. 13 is a waveform diagram showing a burst write operation of a phase change memory device in FIG. 12. Referring to FIG. 13, write pulses for memory cells C1 to Cm are provided during a time interval ΔT1 within each of burst write loops BW loop_1 to BW loop_3. Read pulses for the memory cells C1 to Cm are provided during a time interval ΔT2 within each of the burst write loops BW loop_1 to BW loop_3. Herein, a period of a write pulse is defined as Tww, and a period of a read pulse is defined as Trr. A time interval from supplying of write pulses to supplying of a read pulse is defined as Twr. But, a write pulse and a read pulse may have different pulse widths from each other. In a case where a burst write operation is conducted, a memory cell C1 is supplied with a read pulse after a write pulse is supplied to the memory cell C1 and a time interval ΔT3 elapses. On the other hand, a memory cell Cm is supplied with a read pulse after a write pulse is supplied to the memory cell Cm and a time interval ΔT4 elapses. Since a pulse width of a write pulse is wider than that of a read pulse, the time intervals ΔT3 and ΔT4 may be different from each other. That is, the time interval ΔT3 may be more than the time interval ΔT4. This condition may limit the speed of a verification read operation at a burst write mode because memory cells have different sensing margins due to the difference of the resistance drift. Thus, it is possible to increase the sensing margins of memory cells by controlling a clamp voltage Vcmp even at a burst mode.

Figure 14:
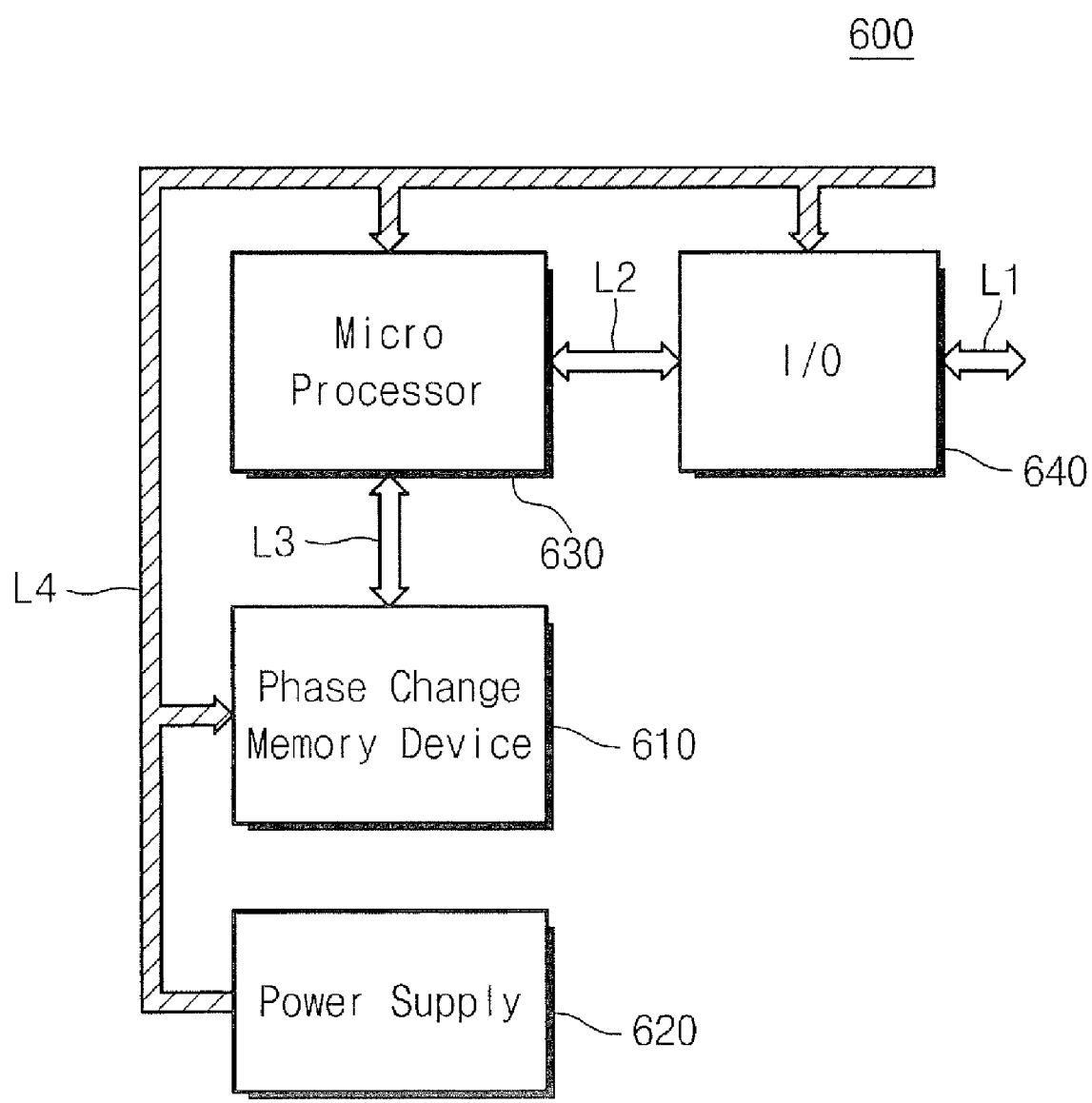
FIG. 14 is a block diagram showing a memory system including a variable resistance memory device according to various embodiments the present invention.

FIG. 14 is a block diagram showing a memory system including a variable resistance memory device according to various embodiments of the present invention. A phase change memory device 610 is connected with a microprocessor 630 via a bus line L3 and is provided as a main memory of an electronic system. A power supply 620 powers the microprocessor 630, an input/output device 640, and the phase change memory device 610 via a power line L4. Herein, the microprocessor 630 and the input/output device 640 are able to be configured as a memory controller for controlling the phase change memory device 610.

In the case that input data is provided to the input/output device 640 via a line L1, the microprocessor 630 processes data received via a line L2 and then transfers the input data or processed data to the phase change memory device 610 via the bus line L3. The phase change memory device 610 stores data provided via the bus line L3. Data stored in memory cells is read by the microprocessor 630 and the read data is sent externally.

Data stored in memory cells of the phase change memory device 610 is not destroyed due to the characteristic of a phase change material even when a power is not supplied to the power line L4 from the power supply 620. This is because the phase change memory device 610 is a non-volatile memory unlike DRAM. Further, the phase change memory device 610 may have advantages that it has a fast operating speed compared to other memory devices and that power consumption is less.

In accordance with phase change memory devices and read methods according to various embodiments of the present invention, the sufficient sensing margin is provided although a write or read operation is conducted in a fast speed.

A phase change memory device according to the present invention is able to be packed using various types of packages. For example, the phase change memory device according to the present invention is able to be packed in packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A variable resistance memory device comprising:
    a memory cell connected to a bit line; and
    a clamp circuit configured to provide either a first read voltage or a second read voltage to the bit line according to an elapsed time from a write operation of the memory cell,
    wherein the first read voltage provided at a first elapsed time is lower than the second voltage provided at a second elapsed time longer than the first elapsed time.

2. The variable resistance memory device of claim 1, wherein the first elapsed time corresponds to a verification read operation for the memory cell.

3. The variable resistance memory device of claim 1, wherein when the memory cell is programmed to have a reset state, a first current generated by the first read voltage at the first elapsed time is same in size to a second current generated by the second read voltage at the second elapsed time.

4. A variable resistance memory device comprising:
    a memory cell connected to a bit line; and
    a clamp circuit configured to provide either a first read voltage or a second read voltage to the bit line according to an elapsed time from a write operation of the memory cell,
    wherein the memory cell comprises a variable resistance substance having a resistance value variable according a write current provided to the bit line; and a select element configured to switch in response to a selection signal provided via a word line.

5. The variable resistance memory device of claim 4, wherein the variable resistance substance comprises a chalcogenide alloy.

6. A read method of a variable resistance memory device comprising:
    determining an elapsed time from a program time of a memory cell to a point of time when a read operation is conducted; and
    sensing data of the memory cell by variably providing a clamp voltage to clamp a bit line of the memory cell according to the elapsed time,
    wherein the determining comprises detecting whether an input command is a write command or a read command; and
    wherein the bit line is clamped to a first read voltage when the write command is detected and to a second read voltage higher than the first read voltage when the read command is detected.

7. The read method of claim 6, wherein a verification read operation is conducted via a bit line clamped to the first read voltage.

* * * * *